US011705611B2

(12) United States Patent
Letcher

(10) Patent No.: US 11,705,611 B2
(45) Date of Patent: Jul. 18, 2023

(54) HIGH-FREQUENCY COAXIAL ATTENUATOR

(71) Applicant: Ryan Letcher, Endicott, NY (US)

(72) Inventor: Ryan Letcher, Endicott, NY (US)

(*) Notice: Subject to any disclaimer, the term of this patent is extended or adjusted under 35 U.S.C. 154(b) by 231 days.

(21) Appl. No.: 17/325,572

(22) Filed: May 20, 2021

(65) Prior Publication Data
US 2022/0376372 A1    Nov. 24, 2022

(51) Int. Cl.
| | |
|---|---|
| *H01P 1/22* | (2006.01) |
| *G01R 31/319* | (2006.01) |
| *H01B 11/18* | (2006.01) |
| *G01R 1/067* | (2006.01) |

(52) U.S. Cl.
CPC .......... *H01P 1/225* (2013.01); *G01R 1/06772* (2013.01); *G01R 31/31905* (2013.01); *H01B 11/18* (2013.01)

(58) Field of Classification Search
CPC .... H01P 1/225; H01P 1/23; H01P 1/22; H01P 1/266; H01P 3/06; G01R 31/31905; G01R 31/319; G01R 1/06772; G01R 1/067; H01B 11/18
See application file for complete search history.

(56) References Cited

U.S. PATENT DOCUMENTS

| 2009/0009272 A1* | 1/2009 | Le Nadan | H01P 1/225 333/81 A |
| 2017/0271826 A1* | 9/2017 | Mende | H01R 24/40 |
| 2020/0006832 A1* | 1/2020 | Gumann | H01P 5/026 |

* cited by examiner

*Primary Examiner* — Stephen E. Jones
(74) *Attorney, Agent, or Firm* — Wenderoth, Lind & Ponack, L.L.P.

(57) ABSTRACT

A high-frequency coaxial attenuator includes a first coaxial cable portion that includes a first center conductor having a first length, and a first insulator of the first length formed around the first center conductor, wherein the first center conductor and the first insulator form a first diameter. A second coaxial cable portion is separated from the first coaxial cable portion by a gap. The second coaxial cable portion includes a second center conductor having a second length, and a second insulator of the second length formed around the second center conductor. A semiconductor material is deposited in the gap between the first coaxial cable portion and the second coaxial cable portion. The semiconductor material may be configured to provide an impedance of 500Ω and provides 20 dB of attenuation, and a 10:1 voltage divider based on a 50Ω input impedance of test equipment.

20 Claims, 8 Drawing Sheets

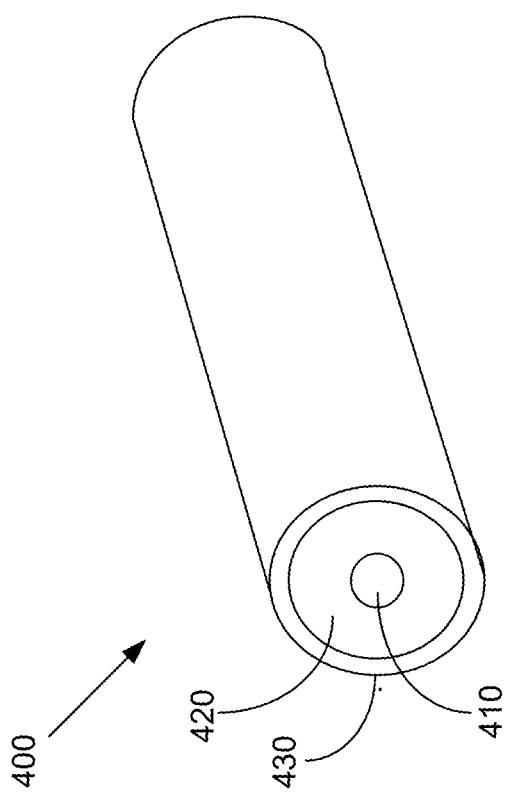
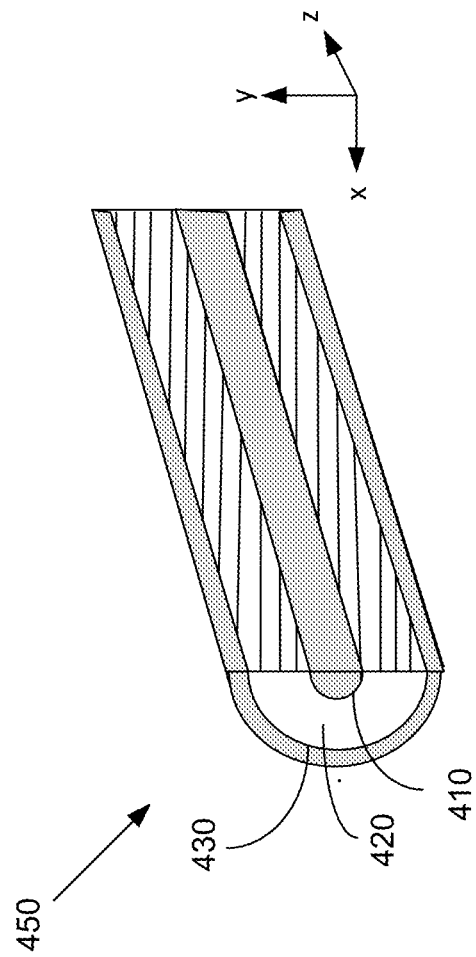

HIGH-FREQUENCY COAXIAL ATTENUATOR

BACKGROUND

Test instruments are subject to the classic measurement problem where the act of connecting a test instrument to a device under test (DUT) affects the measurement. A wide variety of connection techniques are used to minimize measurement errors and any impact on measurement values.

Test probes are used to make a physical and electrical connection between a test point or signal source and the test instrument. The particular application and testing environment will dictate what type of probe should be used. Test probes usually have a defined attenuation ratio, e.g., 1:1, 10:1, 100:1, 1000:1. For example, the input to a test instrument has a defined maximum voltage range. However, an attenuator may also be connected between oscilloscope and oscilloscope probe to attenuate input signals to provide a desired measurement range.

In a conventional attenuator, electric current flows along a conductor through a resistor between the DUT and the test equipment.

SUMMARY

An aspect of the present disclosure involves forming a high-frequency coaxial attenuator that attenuates the electric field in the high-frequency coaxial attenuator.

The high-frequency coaxial attenuator includes a first coaxial cable portion that has a first center conductor having a first length, and a first insulator of the first length formed around the first center conductor, wherein the first center conductor and the first insulator form a first diameter. The high-frequency coaxial attenuator includes a second coaxial cable portion separated from the first coaxial cable portion by a gap of a predetermined length, wherein the second coaxial cable portion includes a second center conductor having a second length, and a second insulator of the second length formed around the second center conductor, wherein the second center conductor and the second insulator form a second diameter. A semiconductor material is deposited in the gap between the first coaxial cable portion and the second coaxial cable portion, wherein the semiconductor material abuts the first coaxial cable portion at a first side of the gap and abuts the second coaxial cable portion at a second side of the gap. An outer conductor is formed having a first portion formed around an outer periphery of the first coaxial portion, a second portion formed around an outer periphery of the second coaxial portion, and a third portion formed around an outer periphery of the semiconductor material.

The first insulator is formed using a first dielectric material and the second insulator is formed using a second dielectric material.

The first diameter is equal to the second diameter and a diameter of the first insulator is equal to a diameter of the second insulator.

The first diameter is greater than the second diameter and a diameter of the first insulator is greater than a diameter of the second insulator.

The semiconductor material is configured to provide predetermined characteristics, wherein the predetermined characteristics comprise at least one of a predetermined attenuation, a predetermined impedance over a particular frequency range, and a predetermined voltage divider ratio.

The semiconductor material is configured with predetermined composition, length, diameter, conductive/loss tangent properties, and dielectric constant to provide the predetermined characteristics.

The semiconductor material is configured to attenuate an electromagnetic wave.

BRIEF SUMMARY OF THE DRAWINGS

The accompanying drawings, which are incorporated in and form a part of the specification, illustrate examples of the subject matter of the present disclosure and, together with the description, serve to explain the principles of the present disclosure. In the drawings:

FIG. 4a illustrates a conventional coaxial attenuator.

FIG. 4b illustrates a cut-away view of the conventional coaxial attenuator.

DETAILED DESCRIPTION

Figure 1:
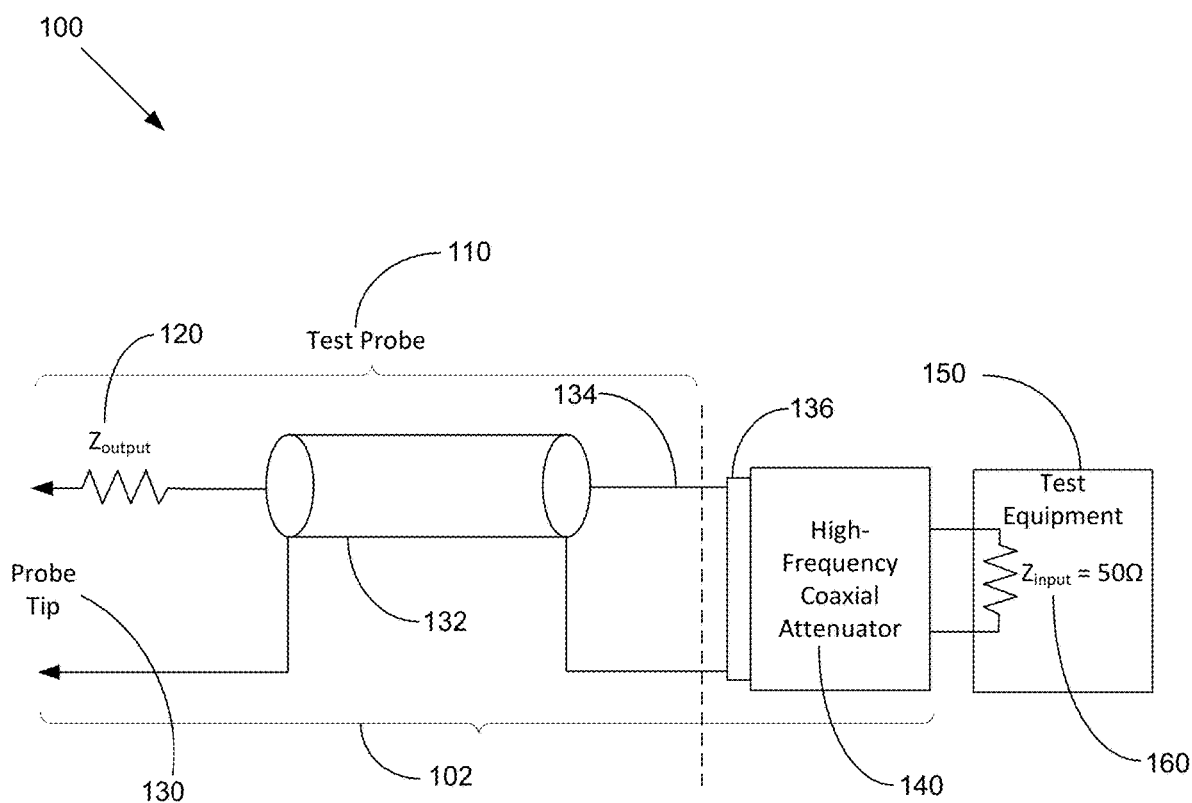
FIG. 1 illustrates a test equipment setup.

The following detailed description is made with reference to the accompanying drawings and is provided to assist in a comprehensive understanding of various example embodiments of the present disclosure. The following description includes various details to assist in that understanding, but these are to be regarded merely as examples and not for the purpose of limiting the present disclosure as defined by the appended claims and their equivalents. The words and phrases used in the following description are merely used to enable a clear and consistent understanding of the present disclosure. In addition, descriptions of well-known structures, functions, and configurations may have been omitted for clarity and conciseness.

Aspects of the present disclosure are directed to forming a high-frequency coaxial attenuator that attenuates the electric field in the high-frequency coaxial attenuator.

Test instruments are subject to the classic measurement problem where the act of connecting a test instrument to a device under test (DUT) affects the measurement. A wide variety of connection techniques are used to minimize measurement errors and any impact on measurement values. Test probes are used to make a physical and electrical connection between a test point or signal source and the test instrument. The particular application and testing environment will dictate what type of probe should be used. For example, the attenuation ratio of the probe (e.g., 1:1, 10:1, 100:1, 1000:1) should be selected to match the test signal amplitude to the vertical sensitivity range of the test equipment. Higher attenuation probe allows the measurement range of a scope to be extended, and lower attenuation probe allows for lower noise measurement.

Input impedance is another important characteristic to consider. Input impedance is used to describe the loading effects of a probe. At DC and low frequency ranges, the probe's resistive component is the main factor that loads down the circuit under test. However, as the frequency goes up, the capacitance of the probe tip, in parallel with the DC resistance, starts to reduce the input impedance of the probe, resulting in greater loading and a more adverse effect to the target. Most test equipment has either a 50Ω or 1 MΩ input resistance. For general-purpose testing, a 1 MΩ input is commonly used. A 50Ω input resistance is used for high-speed signals, propagation delays in logic circuits, and circuit-board impedance testing.

Attenuators are used to lower voltage, dissipate power, and to improve impedance matching. In measuring signals, attenuator are used to lower the amplitude of the signal a known amount to enable measurements, or to protect the measuring device from signal levels that might damage it. Attenuators may also be used to match an impedance by lowering apparent SWR (Standing Wave Ratio).

Specifications for attenuators include the attenuation expressed in decibels of relative power. A 3 dB attenuator will reduce the power to one half, 6 dB to one fourth, 10 dB to one tenth, etc. An attenuator may also be specified by a nominal impedance, a frequency bandwidth, power dissipation, and an input & output standing wave ratio (SWR). For example, an attenuator may be specified to have a nominal impedance of 50 ohms and a frequency bandwidth of DC-18 GHz. Radio frequency (RF) attenuators are typically coaxial in structure with precision connectors as ports and coaxial, micro strip or thin-film internal structure.

An attenuator attenuates the electrical current flowing between the DUT and the test equipment. In an attenuator, electric current flows along a conductor between the DUT and the test equipment. An electric field is produced between the inner conductor and the outer connector. Electric filed can be represented as straight lines emanating from the inner conductor, a dielectric material, and to the outer conductor. A conventional attenuator attenuates the electrical current flowing through the inner and outer conductor, but does not significantly attenuate the electric field.

FIG. 1 illustrates a test equipment setup 100.

In FIG. 1, the test equipment setup 100 includes a probe assembly 102. The probe assembly 102 includes a test probe 110 and a high-frequency coaxial attenuator 140. The probe assembly 102 is connected to test equipment 150. Test equipment 150 may be an oscilloscope, a spectrum analyzer, etc. A high-frequency coaxial attenuator 140 is provided between the test probe 110 and the test equipment 150. The test probe 110 has an output impedance 120, $Z_{output}$, and a probe tip 130. The probe tip 130 extends from the end of an insulated probe body 132, which serves as a handle and also contains components and circuitry specific to the type of test probe 110. Emerging from the other end of the probe body is a cable 134 and cable connector 136, e.g., BNC connector, carries the signal that is to be provided to the test equipment 150. Test equipment 150 is shown having an input impedance, $Z_{input}$ 160, of 50 ohms (Ω).

Test probes 110 may be a passive probe that provides straight through connectivity, 1:1, from the point under test to the input of the test equipment 150. Test probes 110 may also provide an attenuation of a particular value, e.g., using a voltage divider or other circuit. Test probes 110 having an impedance of 50Ω are used to probe circuit boards load the circuits down at Radio Frequency (RF), which has a frequency range from around 20 kHz to around 300 GHz. Thus, the probe assembly 102 should have a high impedance of at least 450Ω.

The high-frequency coaxial attenuator 140 has a broadband frequency response that may range from DC to 20 GHz. The high-frequency coaxial attenuator 140 is configured to provide an impedance of 500Ω at 8 GHz. However, the high-frequency coaxial attenuator 140 may be configured to provide different impedance values at different frequencies. As will be shown in greater detail with respect to FIGS. 6-11, the high-frequency coaxial attenuator 140 is configured to attenuate the electrical current as well as the electric field. The high-frequency coaxial attenuator 140 provides 20 dB of attenuation. Thus, the high-frequency coaxial attenuator 140 provides a 10:1 voltage divider based on the 50Ω input impedance of the test equipment 150. This means that the signal displayed by the test equipment 150 will be 1/10th the magnitude of the actual measured signal so that the high-frequency coaxial attenuator 140 allows for the measurement of a signal that might exceed the limits of the test equipment 150. The high-frequency coaxial attenuator 140 will be described in more detail with reference to FIGS. 6-11 below.

Figure 2:
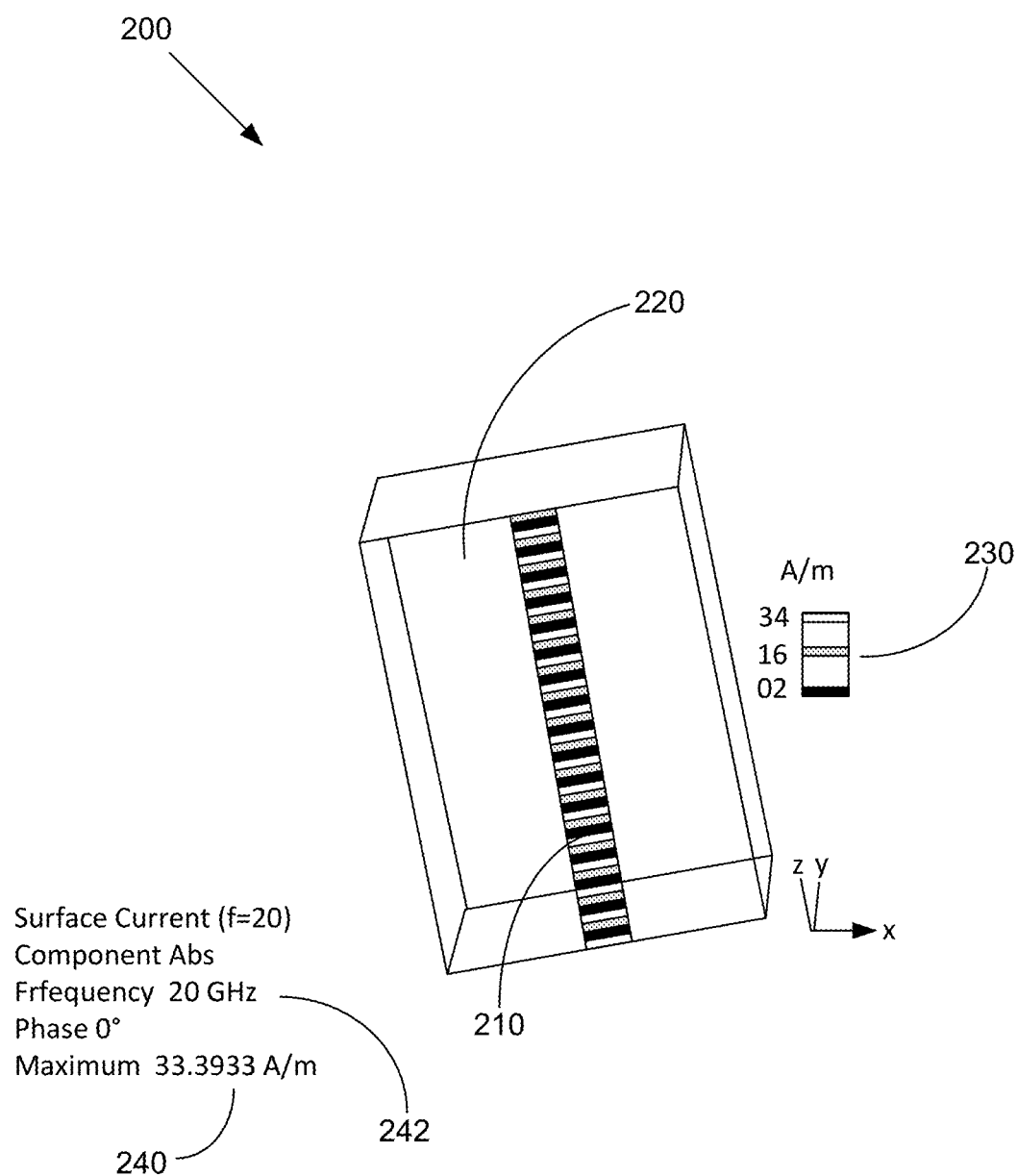
FIG. 2 shows the current density on a printed circuit board.

FIG. 2 shows the current density on a printed circuit board 200.

In FIG. 2, the trace 210 of the current density varies between 2-34 amps/meter on the bottom surface 220 of the printed circuit board as indicated in the legend 230. The maximum current density 240 is shown to be 33.3933 amps/meter at a frequency of 20 GHz 242.

Figure 3:
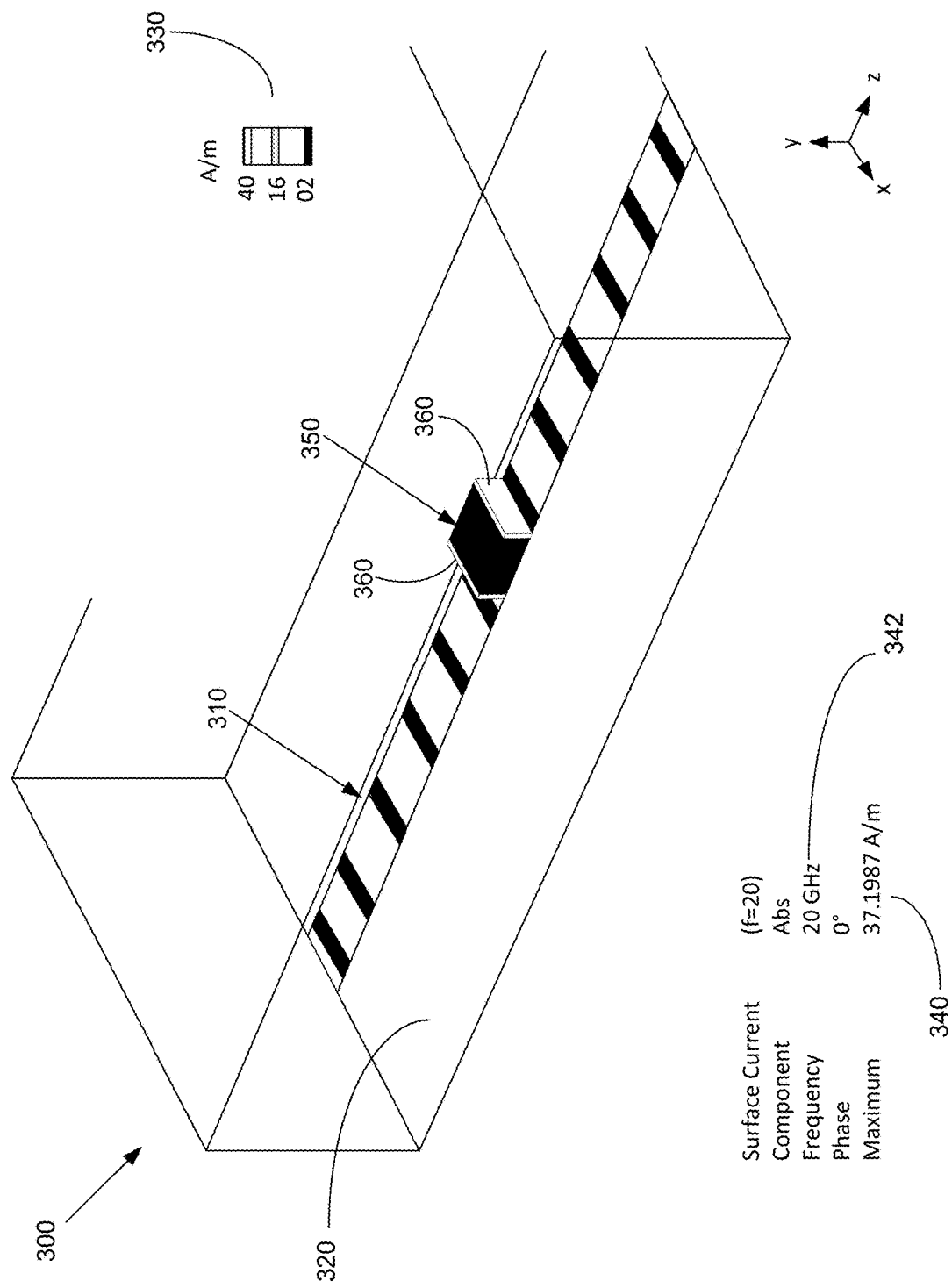
FIG. 3 shows the current density on a microstrip with a chip resistor.

FIG. 3 shows the current density on a microstrip with a chip resistor 300.

In FIG. 3, the trace 310 of the current density varies between 2-40 amps/meter on the bottom surface 320 of the printed circuit board as indicated in the legend 330. The maximum current density 340 is shown to be 37.1987 amps/meter at a frequency of 20 GHz 342. A chip resistor 350 is shown formed along the trace 310. On either side of the chip resistor 350 are conductors 360, such as copper plates.

FIG. 4a illustrates a conventional coaxial attenuator 400.

In FIG. 4a, the conventional coaxial attenuator 400 includes a central conductor 410. An insulator 420 is formed around the central conductor 410. The insulator 420 is formed using a dielectric material. The dielectric material of the insulator 420 is formed surrounding the central conductor 410. The conventional coaxial attenuator 400 includes an outer conductor 430. Attenuation provided by the conventional coaxial attenuator 400 is a function of the permittivity, conductivity, and frequency. Increasing conductivity or frequency increases the attenuation.

FIG. 4b illustrates a cut-away view of the conventional coaxial attenuator 450.

In FIG. 4b, the conventional coaxial attenuator 400 includes a central conductor 410. An insulator 420 is formed around the central conductor 410. The insulator 420 is formed using a dielectric material extending the length of the central conductor 410. The conventional coaxial attenuator 400 also includes an outer conductor 430.

Figure 5:
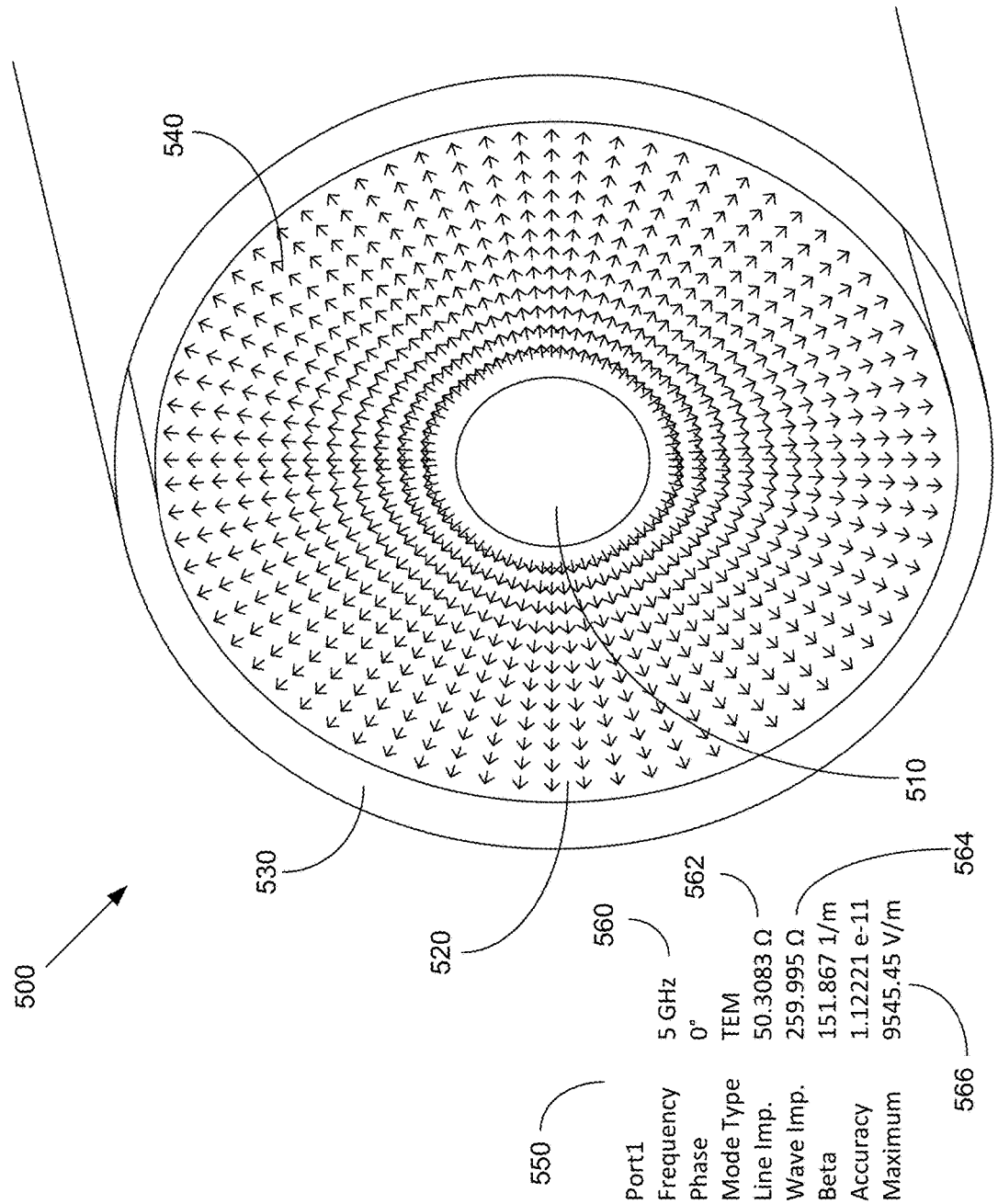
FIG. 5 illustrates field lines in the insulator of the conventional coaxial attenuator.

FIG. 5 illustrates field lines in the insulator of the conventional coaxial attenuator 500.

In FIG. 5, the conventional coaxial attenuator 500 includes a central conductor 510. An insulator 520 is formed around the central conductor 510. The insulator 520 is formed using a dielectric material. The dielectric material of the insulator 520 is formed surrounding the central conductor 510. The conventional coaxial attenuator 500 includes an outer conductor 530. Electric field lines 540 are shown in the insulator 520. The legend 550 shows the frequency is 5 GHz 560, a line impedance of 50.3083Ω 562, a wave impedance of 259.995Ω 564, and a maximum electric field strength of 9545.45 volts/meter 566.

Figure 6:
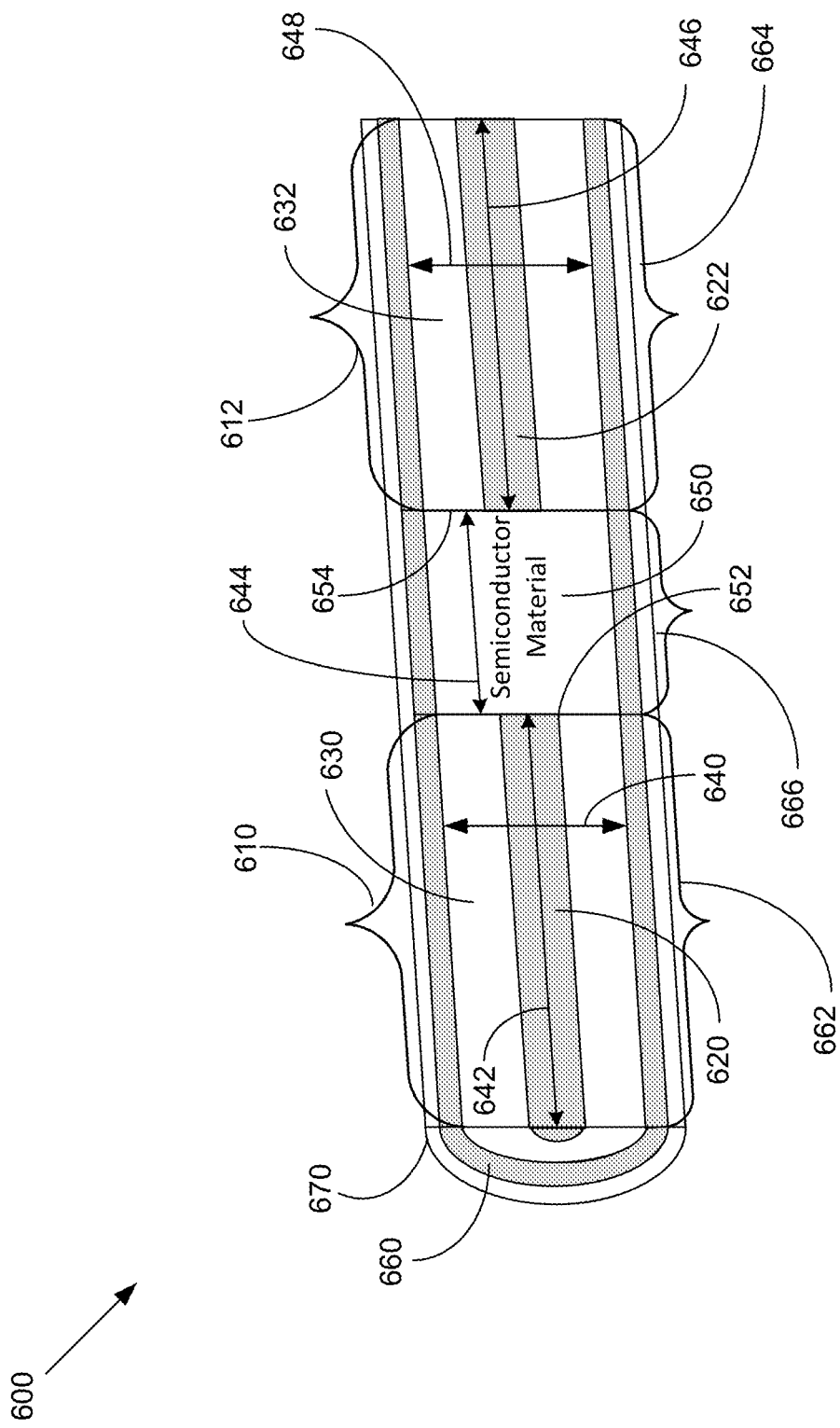
FIG. 6 illustrates a high-frequency coaxial attenuator.

FIG. 6 illustrates a high-frequency coaxial attenuator 600.

In FIG. 6, the high-frequency coaxial attenuator 600 includes a first coaxial cable portion 610 and a second coaxial cable portion 612. The first coaxial cable portion 610 includes a first center conductor 620 having a first length 642, and a first insulator 630 of the first length 642 formed around the first center conductor 620, wherein the first center conductor 620 and the first insulator 630 form a first diameter 640. The second coaxial cable portion 612 is separated from the first coaxial cable portion 610 by a gap of a predetermined length 644. The second coaxial cable portion 612 includes a second center conductor 622 having a second length 646, and a second insulator 632 of the second length 646 formed around the second center conductor 622, wherein the second center conductor 622 and the second insulator 632 form a second diameter 648. The first insulator 630 and the second insulator 632 may be formed using the same dielectric material, or the first insulator 630 and the second insulator 632 may be formed using different dielectric material.

A semiconductor material 650 is deposited in the gap 644 between the first coaxial cable portion 610 and the second coaxial cable portion 612. The semiconductor material 650 abuts the first coaxial cable portion 610 at a first side 652 of the gap 644 and abuts the second coaxial cable portion 612 at a second side 654 of the gap 644. The semiconductor material 650 attenuates an electric field in the first insulator 630 between the outer conductor 660 and the inner conductor 620, and in the second insulator 632 between the outer conductor 660 and the inner conductor 620.

An outer conductor 660 is formed around the first insulator 630, the semiconductor material 650, and the second insulator 632. The outer conductor 660 may be continuous or may include a first portion 662 formed around an outer periphery of the first coaxial portion 610, a second portion 664 formed around an outer periphery of the second coaxial portion 612, and a third portion 666 formed around an outer periphery of the semiconductor material 650. A sheath 670 is formed around the outer conductor 660.

The semiconductor material 650 may be configured to provide predetermined characteristics. For example, the predetermined characteristics may include a predetermined attenuation, a predetermined impedance over a particular frequency, and a predetermined voltage divider ratio. For example, the semiconductor material 650 may be configured to provide an attenuation of 20 dB, an impedance of 500Ω at 8 GHz, and a voltage divider ratio of 10:1 to the input of test equipment having an input impedance of 50Ω. However, semiconductor material 650 may be configured to provide other characteristic values.

The first diameter 640 of the first center conductor 620 and the first insulator 630 may be equal to the second diameter 648 of the second center conductor 622 and the second insulator 632. Alternatively, the first diameter 640 may be greater than the second diameter 648. The difference between the first diameter 640 and the second diameter 648 may be based on the use of different dielectric materials used to form the first insulator 630 and the second insulator 632. Further, the semiconductor material 650 may be configured with predetermined composition, length, diameter, conductive/loss tangent properties, and dielectric constant to provide the predetermined characteristics.

Figure 7:
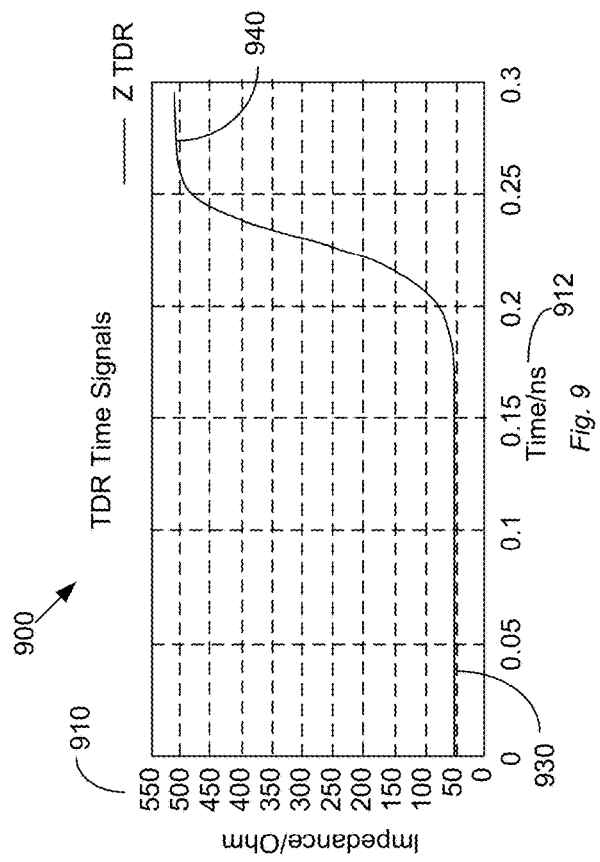
FIG. 7 is a graph of impedance versus time for a conventional coaxial attenuator.

FIG. 7 is a graph 700 of impedance versus time for a conventional coaxial attenuator.

In FIG. 7, the impedance 710 varies over time 712 from an upper value 720 to a lower value 730, but remains around 50Ω.

Figure 8:
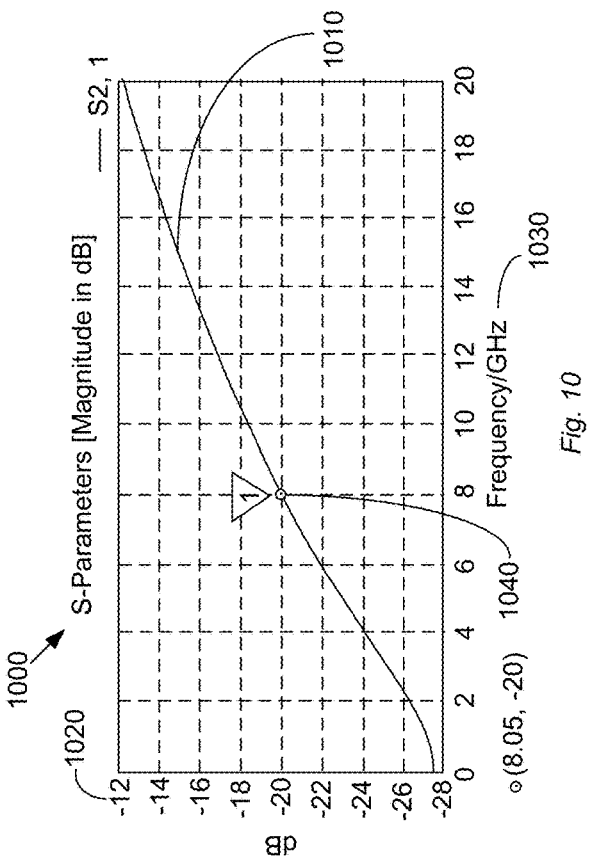
FIG. 8 is a graph of attenuation versus frequency for a conventional coaxial attenuator.

FIG. 8 is a graph 800 of attenuation versus frequency for a conventional coaxial attenuator.

In FIG. 8, the plot 810 of magnitude of attenuation 820 versus frequency 830 is shown. However, the attenuation does not vary significantly over the span of 0-20 GHz.

Figure 9:
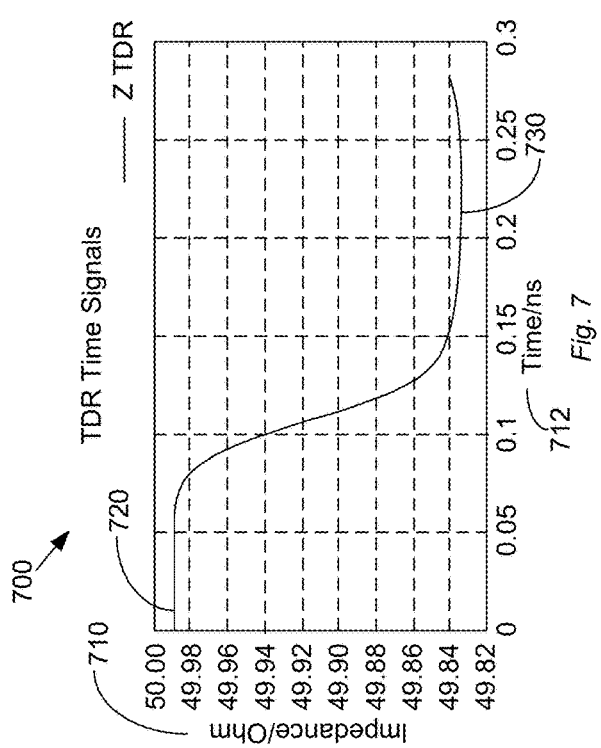
FIG. 9 is a graph of impedance versus time for a high-frequency coaxial attenuator as disclosed herein.

FIG. 9 is a graph 900 of impedance versus time for a high-frequency coaxial attenuator as disclosed herein.

In FIG. 9, the impedance 910 varies over time 912 from a lower value 930 of about 50Ω to an upper value 940 of about 500Ω.

Figure 10:
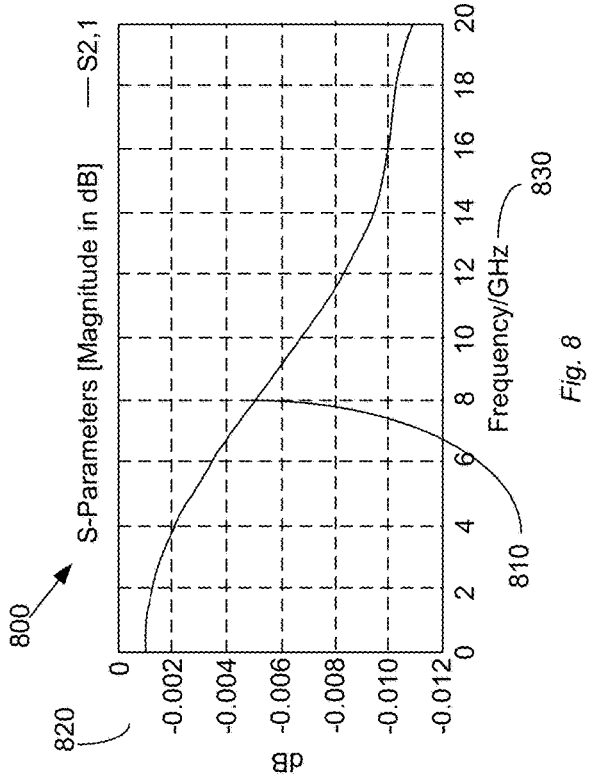
FIG. 10 is a graph of attenuation versus frequency for a high-frequency coaxial attenuator as disclosed herein.

FIG. 10 is a graph 1000 of attenuation versus frequency for a high-frequency coaxial attenuator as disclosed herein.

In FIG. 10, the plot 1010 of magnitude of attenuation 1020 versus frequency 1030 is shown. However, in FIG. 10, the attenuation varies significantly over the span of 0-20 GHz. Attenuation 1020 at 0 GHz is almost 28 dB whereas the attenuation 1020 at 20 GHz is about 12 dB. However, according to the predetermined characteristics described above, the attenuation 1020 is 20 dB at 8 GHz 1040. However, the high-frequency coaxial attenuator may be configured to provide other predetermined characteristics as needed by alternative design goals.

Figure 11:
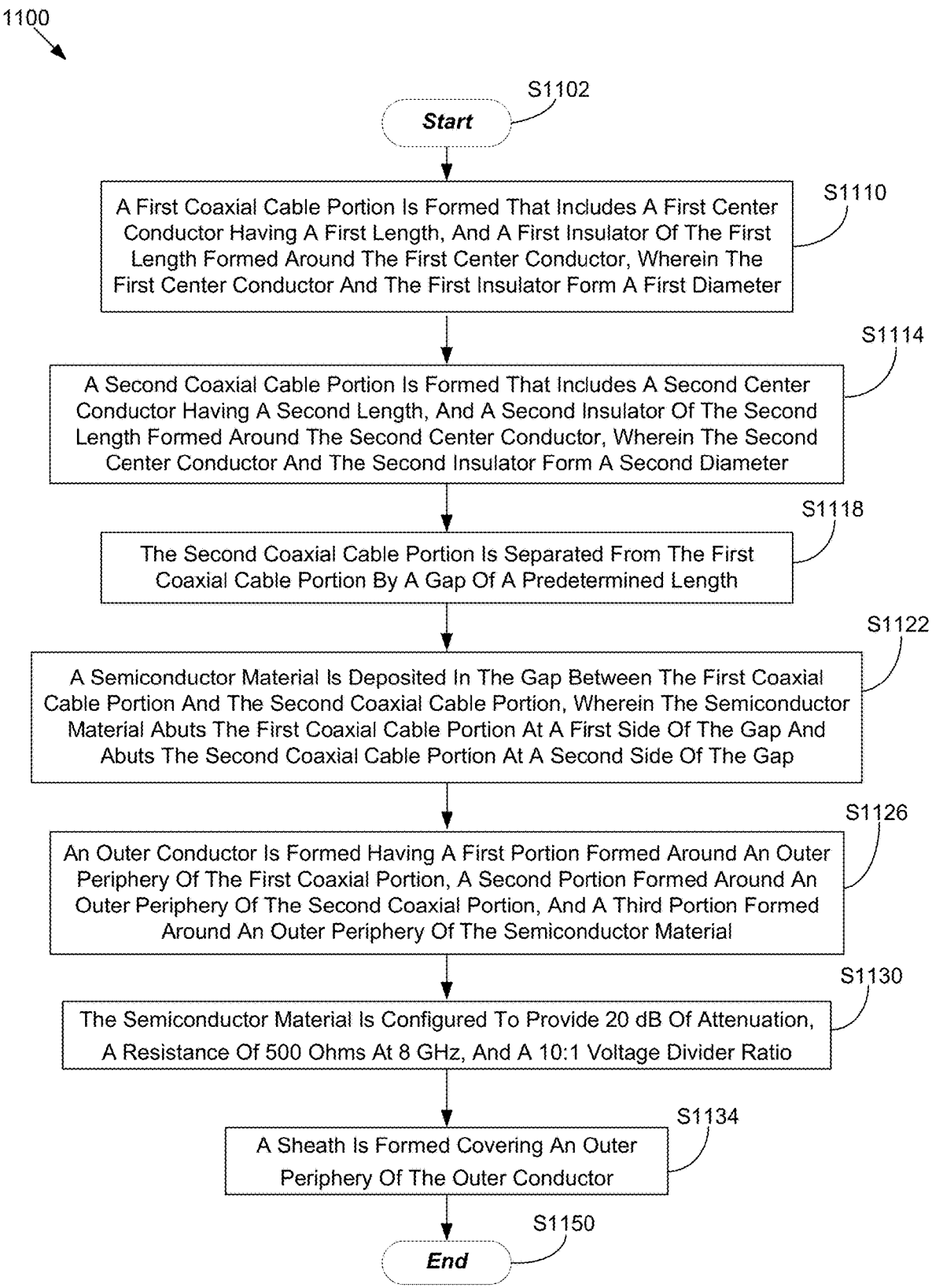
FIG. 11 illustrates a flow chart of a method for forming a high-frequency coaxial attenuator.

FIG. 11 illustrates a flow chart 1100 of a method for forming a high-frequency coaxial attenuator.

In FIG. 11, method 1100 starts (S1102), and a first coaxial cable portion is formed that includes a first center conductor having a first length, and a first insulator of the first length formed around the first center conductor, wherein the first center conductor and the first insulator form a first diameter (S1110). Referring to FIG. 6, the high-frequency coaxial attenuator 600 includes a first coaxial cable portion 610 and a second coaxial cable portion 612. The first coaxial cable portion 610 includes a first center conductor 620 having a first length 642, and a first insulator 630 of the first length 642 formed around the first center conductor 620, wherein the first center conductor 620 and the first insulator 630 form a first diameter 640.

A second coaxial cable portion is formed that includes a second center conductor having a second length, and a second insulator of the second length formed around the second center conductor, wherein the second center conductor and the second insulator form a second diameter (S1114). In FIG. 6, the second coaxial cable portion 612 includes a second center conductor 622 having a second length 646, and a second insulator 632 of the second length 646 formed around the second center conductor 622, wherein the second center conductor 622 and the second insulator 632 form a second diameter 648.

The second coaxial cable portion is separated from the first coaxial cable portion by a gap of a predetermined length (S1118). Referring to FIG. 6, the second coaxial cable portion 612 is separated from the first coaxial cable portion 610 by a gap of a predetermined length 644.

A semiconductor material is deposited in the gap between the first coaxial cable portion and the second coaxial cable portion, wherein the semiconductor material abuts the first coaxial cable portion at a first side of the gap and abuts the second coaxial cable portion at a second side of the gap (S1122). Referring to FIG. 6, a semiconductor material 650 is deposited in the gap 644 between the first coaxial cable portion 610 and the second coaxial cable portion 612. The semiconductor material 650 abuts the first coaxial cable portion 610 at a first side 652 of the gap 644 and abuts the second coaxial cable portion 612 at a second side 654 of the gap 644. The semiconductor material 650 attenuates an electric field in the first insulator 630 between the outer conductor 660 and the inner conductor 620, and in the second insulator 632 between the outer conductor 660 and the inner conductor 620.

An outer conductor is formed having a first portion formed around an outer periphery of the first coaxial portion, a second portion formed around an outer periphery of the second coaxial portion, and a third portion formed around an outer periphery of the semiconductor material (S1126). FIG. 6 shows an outer conductor 660 is formed around the first insulator 630, the semiconductor material 650, and the second insulator 632. The outer conductor 660 may be continuous or may include a first portion 662 formed around an outer periphery of the first coaxial portion 610, a second portion 664 formed around an outer periphery of the second coaxial portion 612, and a third portion 666 formed around an outer periphery of the semiconductor material 650.

The semiconductor material is configured to provide 20 dB of attenuation, a resistance of 500 ohms at 8 GHz, and a 10:1 voltage divider ratio (S1130). Referring to FIG. 6, the semiconductor material 650 is configured to provide predetermined characteristics. For example, the predetermined characteristics include a predetermined attenuation, a predetermined impedance over a particular frequency, and a predetermined voltage divider ratio. For example, the semiconductor material 650 may be configured to provide an attenuation of 20 dB, an impedance of 500Ω at 8 GHz, and a voltage divider ratio of 10:1 to the input of test equipment having an input impedance of 50Ω. However, semiconductor may be configured to provide other characteristic values.

Next, a sheath is formed covering an outer periphery of the outer conductor (S1134). Referring to FIG. 6, a sheath 670 is shown formed around the outer conductor 660. The method 1100 then ends (S1150).

Those having ordinary skill in the art readily recognize that the techniques described above can be utilized in a variety of devices, environments, and situations. Although the subject matter has been described in language specific to structural features or methodological acts, it is to be understood that the subject matter defined in the appended claims is not necessarily limited to the specific features or acts described. Rather, the specific features and acts are disclosed as exemplary forms of implementing the claims.

What is claimed is:

1. A high-frequency coaxial attenuator, comprising:
   a first coaxial cable portion comprising:
      a first center conductor having a first length;
      a first insulator of the first length formed around the first center conductor, wherein the first center conductor and the first insulator form a first diameter; and
   a second coaxial cable portion separated from the first coaxial cable portion by a gap of a predetermined length, the second coaxial cable portion comprising:
      a second center conductor having a second length; and
      a second insulator of the second length formed around the second center conductor, wherein the second center conductor and the second insulator form a second diameter;
   a semiconductor material deposited in the gap between the first coaxial cable portion and the second coaxial cable portion, wherein the semiconductor material abuts the first coaxial cable portion at a first side of the gap and abuts the second coaxial cable portion at a second side of the gap; and
   an outer conductor, the outer conductor having a first portion formed around an outer periphery of the first coaxial portion, a second portion formed around an outer periphery of the second coaxial portion, and a third portion formed around an outer periphery of the semiconductor material.

2. The high-frequency coaxial attenuator of claim 1, wherein the first insulator comprises a first dielectric material and the second insulator comprises a second dielectric material.

3. The high-frequency coaxial attenuator of claim 2, wherein the first dielectric material and the second dielectric material comprises one of the first dielectric material and the second dielectric material being a same dielectric material, and the first dielectric material and the second dielectric material being different dielectric materials.

4. The high-frequency coaxial attenuator of claim 1, wherein the first diameter is equal to the second diameter and a diameter of the first insulator is equal to a diameter of the second insulator.

5. The high-frequency coaxial attenuator of claim 1, wherein the first diameter is greater than the second diameter and a diameter of the first insulator is greater than a diameter of the second insulator.

6. The high-frequency coaxial attenuator of claim 1, wherein the semiconductor material is configured to provide predetermined characteristics.

7. The high-frequency coaxial attenuator of claim 6, wherein the predetermined characteristics comprise at least one of a predetermined attenuation, a predetermined impedance over a particular frequency, and a predetermined voltage divider ratio.

8. The high-frequency coaxial attenuator of claim 6, wherein the semiconductor material is configured with predetermined composition, length, diameter, conductive/loss tangent properties, and dielectric constant to provide the predetermined characteristics.

9. The high-frequency coaxial attenuator of claim 1, wherein the semiconductor material attenuates an electromagnetic wave.

10. A probe assembly for measuring parameters of a device under test, comprising:
    a probe tip for contacting the device under test;
    a probe cable having output leads and a predetermined output impedance;
    a high-frequency coaxial attenuator coupled to the output leads of the probe cable, the high-frequency coaxial attenuator including:
       a first coaxial cable portion comprising:
          a first center conductor having a first length; and
          a first insulator of the first length formed around the first center conductor, wherein the first center conductor and the first insulator form a first diameter;
       a second coaxial cable portion separated from the first coaxial cable portion by a gap of a predetermined length, the second coaxial cable portion comprising:
          a second center conductor having a second length; and
          a second insulator of the second length formed around the second center conductor, wherein the second center conductor and the second insulator form a second diameter;
       a semiconductor material deposited in the gap between the first coaxial cable portion and the second coaxial cable portion, wherein the semiconductor material abuts the first coaxial cable portion at a first side of the gap and abuts the second coaxial cable portion at a second side of the gap; and an outer conductor, the outer conductor having a first portion formed around an outer periphery of the first coaxial portion, a second portion formed around an outer periphery of the second coaxial portion, and a third portion formed around an outer periphery of the semiconductor material.

11. The probe assembly of claim 10, wherein the first insulator comprises a first dielectric material and the second insulator comprises a second dielectric material.

12. The probe assembly of claim 11, wherein the first dielectric material and the second dielectric material comprise one of the first dielectric material and the second dielectric material being a same dielectric material, and the first dielectric material and the second dielectric material being different dielectric materials.

13. The probe assembly of claim 10, wherein the first diameter is equal to the second diameter and a diameter of the first insulator is equal to a diameter of the second insulator.

14. The probe assembly of claim 10, wherein the first diameter is greater than the second diameter and a diameter of the first insulator is greater than a diameter of the second insulator.

15. The probe assembly of claim 10, wherein the semiconductor material is configured to provide predetermined characteristics, wherein the predetermined characteristics comprise at least one of a predetermined attenuation, a predetermined impedance over a particular frequency, and a predetermined voltage divider ratio.

16. A method for making a high-frequency coaxial attenuator, comprising:

forming a first coaxial cable portion comprising a first center conductor having a first length; and a first insulator of the first length formed around the first center conductor, wherein the first center conductor and the first insulator form a first diameter;

forming a second coaxial cable portion separated from the first coaxial cable portion by a gap of a predetermined length, wherein the forming the second coaxial cable portion includes forming a second center conductor having a second length, and a second insulator of the second length formed around the second center conductor, wherein the second center conductor and the second insulator form a second diameter;

depositing a semiconductor material in the gap between the first coaxial cable portion and the second coaxial cable portion, wherein the semiconductor material is deposited abutting the first coaxial cable portion at a first side of the gap and abutting the second coaxial cable portion at a second side of the gap; and forming an outer conductor having a first portion formed around an outer periphery of the first coaxial portion, a second portion formed around an outer periphery of the second coaxial portion, and a third portion formed around an outer periphery of the semiconductor material.

17. The method of claim 16, wherein the forming the first insulator comprises forming a first dielectric material and the forming the second insulator comprises forming a second dielectric material.

18. The method of claim 17, wherein the forming the first dielectric material and the forming the second dielectric material further comprises using one of a same dielectric material for the first dielectric material and the second dielectric material, and different dielectric materials for the first dielectric material and the second dielectric material.

19. The method of claim 16, wherein the forming the first center conductor and the first insulator with the first diameter and forming the second center conductor and the second insulator with the second diameter comprises one of forming the first center conductor and the first insulator with the first diameter equal to the second diameter of the second center conductor and the second insulator, and forming the first center conductor and the first insulator with the first diameter greater than the second diameter of the second center conductor and the second insulator.

20. The method of claim 16, wherein the depositing the semiconductor material comprises depositing the semiconductor material with predetermined characteristics, wherein the predetermined characteristics comprise at least one of a predetermined attenuation, a predetermined impedance over a particular frequency, and a predetermined voltage divider ratio.

* * * * *